(12) United States Patent
Maqueira

(10) Patent No.: US 6,867,642 B1
(45) Date of Patent: Mar. 15, 2005

(54) REALTIME ADAPTIVE NOTCH COMPENSATOR

(75) Inventor: Benigno Maqueira, Ocoee, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/649,980

(22) Filed: Aug. 25, 2003

(51) Int. Cl.[7] .............................................. H03K 5/00
(52) U.S. Cl. ...................................... 327/556; 375/350
(58) Field of Search ............................... 327/551–559; 375/350; 708/300, 322

(56) References Cited

U.S. PATENT DOCUMENTS 3,355,668 A * 11/1967 Boensel et al. ............. 327/556
5,307,517 A * 4/1994 Rich ........................... 455/306
5,331,299 A * 7/1994 Smith ......................... 333/175
5,758,275 A * 5/1998 Cox et al. .................... 455/307

* cited by examiner

Primary Examiner—Kenneth B. Wells
(74) Attorney, Agent, or Firm—Jeffrey D. Myers; Peacock Myers & Adams, PC

(57) ABSTRACT

A notch compensation apparatus and method comprising, based on input to and output from a notch filter, dynamically calculating a desired change to a notch frequency of the notch filter and specifying the desired change to the notch filter so as to cancel an input resonance of uncertain or time varying frequency.

19 Claims, 5 Drawing Sheets

REALTIME ADAPTIVE NOTCH COMPENSATOR

CROSS-REFERENCE TO RELATED APPLICATIONS

Not Applicable.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

The present invention relates to methods and apparatuses for reducing effects of 1) structural resonances in the control of mechanical structures, such as gimbaled turrets and 2) noise harmonics of time varying and/or uncertain frequency, such as the spin frequency noise in rate gyroscopes subject to power fluctuations.

2. Description of Related Art

In the control of mechanical structures, such as gimbaled turrets, the frequency of structural resonances must be known so they can be cancelled with notch filters in the controller to keep the feedback control loop stable. The present invention adaptively computes the frequency of the resonance in realtime during normal closed-loop operation of the controller to improve the accuracy of the frequency estimate and adapt to changes with time in the resonance frequency. With a rough initial estimate, the Realtime Adaptive Notch Compensator (RANC) of the invention solves for a more accurate estimate of the frequency and compensates the notch filter to stabilize the control loop thus minimizing oscillations due to the structural resonance.

Structural resonances are problematic in that they are very narrow in bandwidth, they vary from system to system even with identical structure design, and, in a given system, may also vary with gimbal position, temperature, and vehicle high-g maneuvers.

The conventional approach is to measure and characterize each system to determine the frequency at which structural resonances occur. Constant, dedicated notches are then placed at these frequencies to attenuate the resonance amplitude. These notches must be narrow in width; otherwise they will significantly degrade the controller's performance, in particular, the phase and gain stability margins. The emphasis on narrow notches increases the accuracy with which the structural frequency must be known, thus, making the measurement process lengthy and expensive.

The frequency measurement process can be extended to generate look-up tables of frequency versus gimbal position, temperature, vehicle acceleration, etc. These tables can then be implemented in an open-loop fashion in the controller to set the notch frequency depending on gimbal position, temperature, vehicle acceleration, etc. The open-loop nature, however, provides no feedback indication that the frequency was adjusted properly to minimize oscillations.

Another approach is to minimize the interaction of structural resonances with the controller by designing stiffer structures such that resonances occur at higher frequencies where they cannot be excited by the controller. The disadvantage is larger, heavier structures or structures built with expensive materials. Alternately, the controller bandwidth is kept low (at the expense of performance) such that the controller does not excite structural resonances.

Notch filters are also used to filter out noise harmonics in sensors such as spin frequency noise in rate gyroscopes. The RANC of the invention is also applicable in such application to compensate for variations in spin frequency due, for example, to temperature changes or power fluctuations.

The prior art approach is exemplified schematically in FIG. 1, wherein an input signal 10 to be measured is corrupted by sensor 12 with harmonic noise of constant frequency $\omega_n$, which is processed by notch filter 14 at fixed frequency $\omega_n$, resulting in filtered output 16 and notch output error 18. The notch output error 18 is calculated via summing node 19 as the difference between the true input signal 10 and the filtered output 16.

BRIEF SUMMARY OF THE INVENTION

The present invention is of a notch compensator comprising: means for receiving input to a notch filter; means for receiving output from the notch filter; means for dynamically calculating a desired change to a notch frequency of the notch filter; and means for specifying the desired change to the notch filter. In the preferred embodiment, the input receiving means comprises a first pre-filter providing a notch output error as output, the output receiving means comprises the first pre-filter, and the input receiving means comprises a second pre-filter providing a reference signal as output. The calculating means comprises demodulation means receiving input from the first and second pre-filters, with preferably the demodulation means providing a frequency error as output. The calculating means additionally comprises integral compensation means receiving the frequency error as input, preferably wherein the integral compensation means minimizes the notch output error. The demodulation means most preferably comprises a low pass filter that is second order with a bandwidth about one decade below an expected value of a next notch frequency.

The present invention is also of a notch compensation method comprising: receiving input to a notch filter; receiving output from the notch filter; dynamically calculating a desired change to a notch frequency of the notch filter; and specifying the desired change to the notch filter. In the preferred embodiment, receiving input comprises employing a first pre-filter that provides a notch output error as output, receiving output comprises employing the first pre-filter, and receiving input comprises employing a second pre-filter that provides a reference signal as output. Calculating comprises demodulating employing input from the first and second pre-filters, preferably wherein the demodulating step provides a frequency error as output. Calculating preferably additionally comprises performing integral compensation employing the frequency error as input, most preferably wherein performing integral compensation minimizes the notch output error. Demodulating most preferably comprises employing a low pass filter that is second order with a bandwidth about one decade below an expected value of a next notch frequency.

The present invention is additionally of a notch filtering system comprising a notch filter and a notch compensator as described above. The system is useful in reducing structural resonances in control of mechanical structures, reducing noise harmonics of time varying and/or uncertain frequency, adaptive harmonic noise identification, adaptive harmonic noise filtering, and control of flexible structures. The system is also useful in control of gimbaled turrets, control of helicopters, stabilization platforms, gyroscopic rate sensors, computer hard drives, vehicle body bending compensation, and flexible robotic manipulators.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

The present invention is of an apparatus and method for control of mechanical structures with uncertain and/or time varying structural resonances (e.g., gimbaled turrets, seekers). The invention employs notch filters to provide stability in the presence of uncertain and/or time varying resonances. Resonances are narrow in bandwidth, vary from system to system even with identical structure design, and may also vary with gimbal position, temperature, and/or vehicle maneuvers (high-g, g-vector). Accordingly, notch filters must also be narrow in bandwidth to minimize phase margin loss which implies that the resonance frequency must be known accurately.

The present invention adaptively estimates the frequency of the resonance in realtime during normal closed-loop operation of the controller and compensates the notch filter to most effectively attenuate the resonance. The invention updates the frequency estimate to improve its accuracy from system to system—in a given system, the invention corrects for errors in the initial estimate and adapts to changes in frequency with time. Effectively, the invention also minimizes oscillations due to the resonance over the entire system operating range, which results in improved overall stabilization (e.g., for line-of-sight control for a gimbaled turret).

Figure 2:
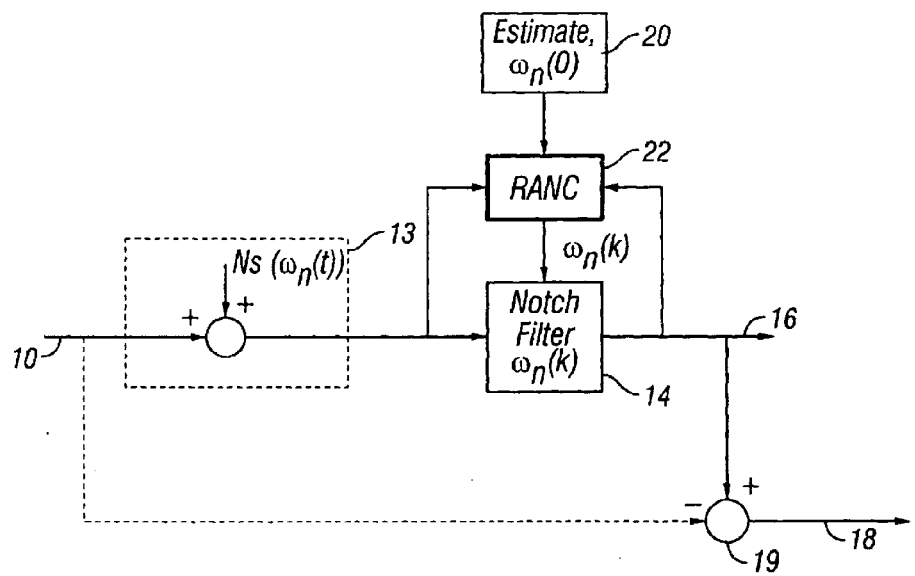
FIG. 2 is a block diagram of the RANC signal processing of the present invention resulting in adaptive harmonic filtering.
Figure 3:
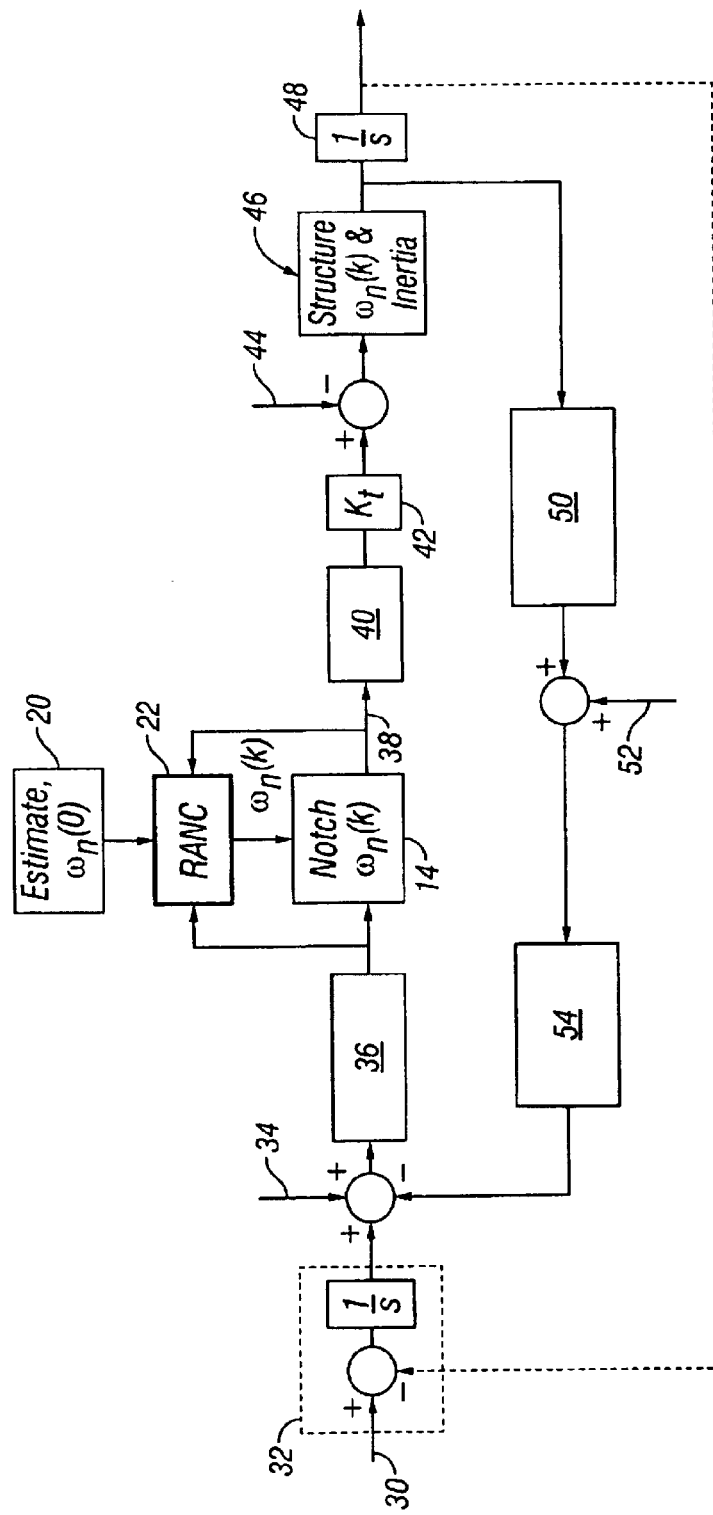
FIG. 3 is a block diagram of the invention employed in a rate and/or acceleration control loop for adaptive structural resonance compensation.
Figure 4:
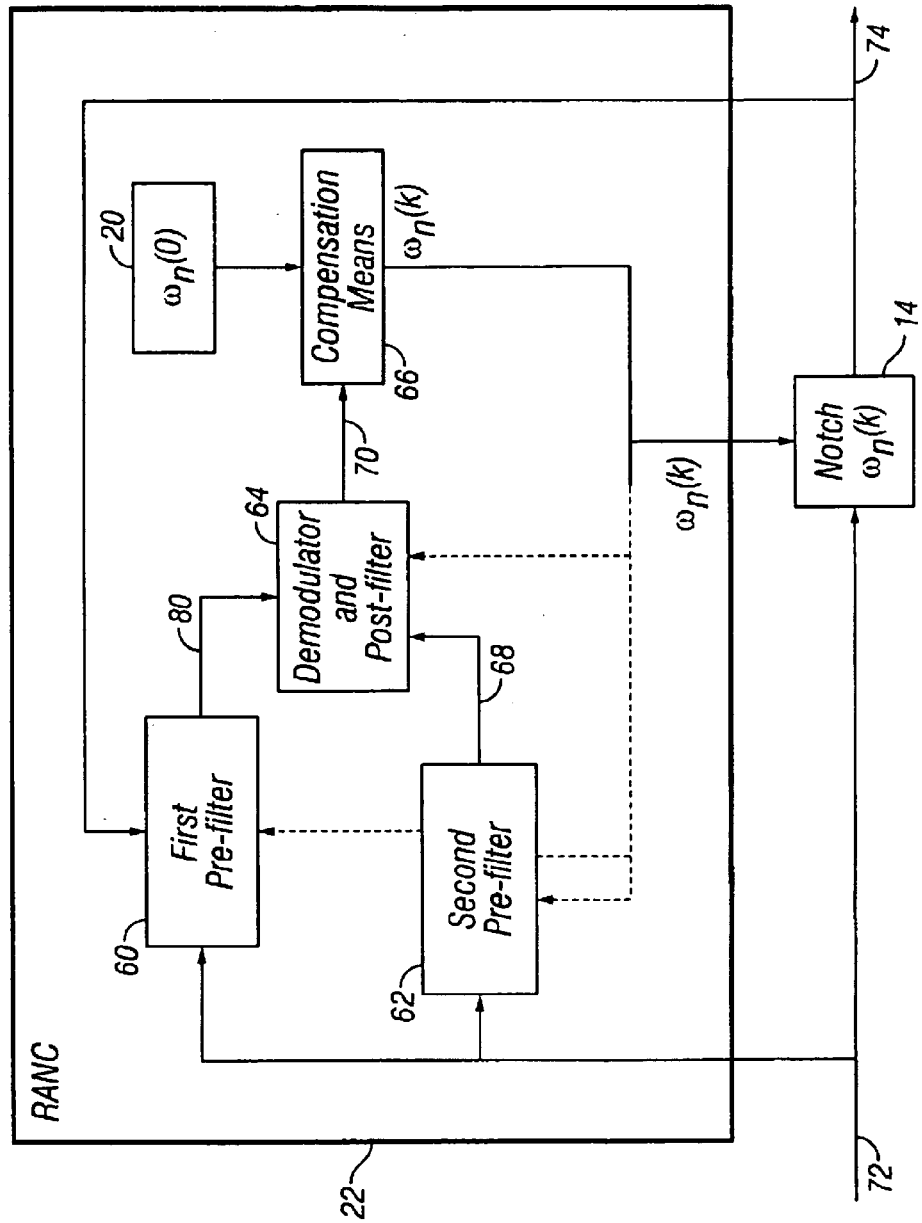
FIG. 4 is a block diagram of the preferred RANC processing components and interface with the notch filter.

The present invention is preferably implemented in the controller as a stand-alone algorithm running in parallel with a pre-existing conventional notch filter (FIGS. 2–3). The RANC monitors both the input to the notch filter and its output. In return, the RANC compensates the notch filter with an updated estimate of the resonance frequency. The invention updates the estimate of $\omega_n$ by means of a pre-filtering, demodulation, and post-filtering means to generate a frequency error 70 (FIG. 4). Compensation is applied to the error signal to update the estimate of $\omega_n$ such that the notch output error 80 (FIG. 5) is minimized. The RANC of the invention is preferably operated as a closed-loop system of, for example, about 10 Hz bandwidth, and runs in parallel with the controller. The notch filter is thereby implemented as a time-varying filter with the natural frequency as an input variable instead of a constant. The invention is fast enough to handle step changes in $\omega_n$ and yet remains robust in the presence of noise. The invention exploits the phase response of notch filters to locate $\omega_n$. Near the notch frequency the phase is approximately linear and about the notch frequency the gain is approximately symmetrical.

Figure 1:
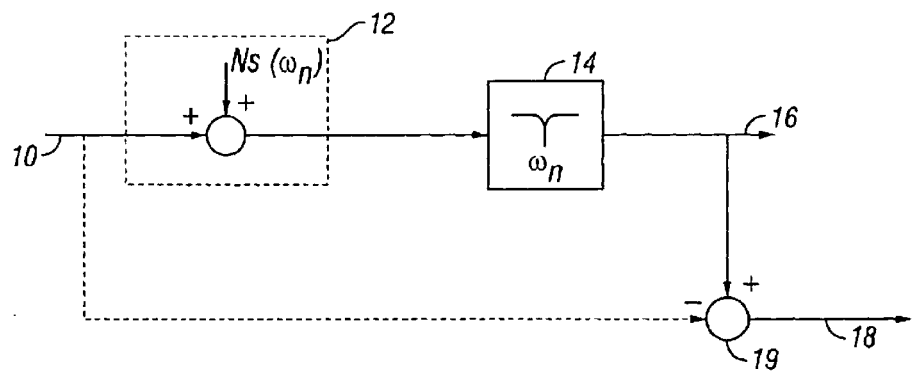
FIG. 1 is a block diagram of prior art conventional notch filtering of harmonic noise in a signal processing application.

The preferred embodiment of the invention is now described with respect to FIGS. 2–6. FIG. 2 shows the invention in comparison to the prior art shown in FIG. 1. Rather than assuming harmonic noise of constant frequency, the present invention accounts for a corrupted sensor 13 including harmonic noise of time varying frequency $\omega_n(t)$. The RANC 22 and notch filter 14 employ an initial estimate 20 of the harmonic frequency, $\omega_n(0)$. The RANC samples both input and output of the notch filter and provides to the notch filter updated frequency estimate $\omega_n(k)$. Note that elements 20,22,14 may in fact be a plurality of such elements to handle a plurality of resonance features in a system.

A sample system employing RANC for structural resonance compensation is shown in FIG. 3, including rate command 30, rate integrating gyroscope ("RIG") 32, gyro noise 34, compensation means 36, drive command 38, amplifier 40, motor torque constant 42, disturbance $T_d$ 44, gimbal with structural resonance 46, integrator for gimbal rate (inertial) 48, angular accelerometer 50, accelerometer noise 52, and feedback compensation 54. An inherent characteristic of this application is that tThe resonance amplitude trends to noise level as $\omega_n(k)$ approaches $\omega_n(t)$, thus rendering conventional techniques impractical.

FIG. 4 shows details of the preferred RANC of the invention in conjunction with notch input 72 and notch output 74. The preferred RANC comprises first pre-filter 60, second pre-filter 62, demodulator and post filter 64, compensation means 66, reference signal 68, frequency update $\omega_n(k)$ 76, and error signal $e_\omega$70.

Figure 5:
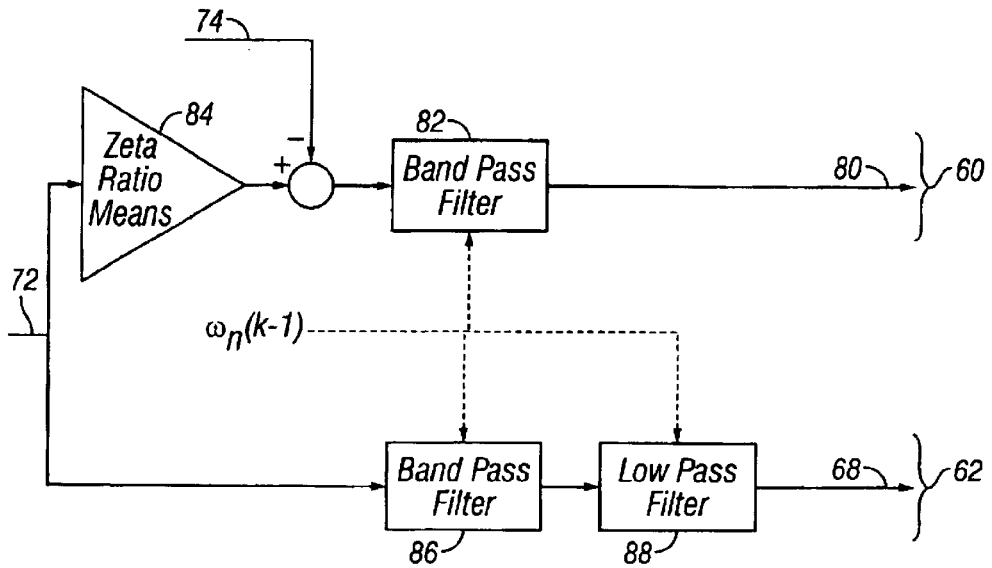
FIG. 5 is a block diagram of the preferred embodiment of the two pre-filters of the embodiment of FIG. 4.

FIG. 5 shows details of the preferred pre-filters. The first pre-filter comprises zeta ratio means 84 and band pass filter 82 to provide notch error 80. The zeta ratio attenuates the notch input 72 to match the attenuation of the notch filter at $\omega_n(k)$ such that the error at $\omega_n(k)$ approaches zero as $\omega_n(k)$ approaches the resonance frequency of the input signal. The second pre-filter comprises band pass filter 86 and low pass filter 88 to provide reference signal 68. The band pass filters attenuate noise and disturbances at frequencies below and above $\omega_n(k)$ and the low pass filter produces a 90 degree phase lag at $\omega_n(k)$ between the reference 68 and notch error 80 by means of a second order filter.

Figure 6:
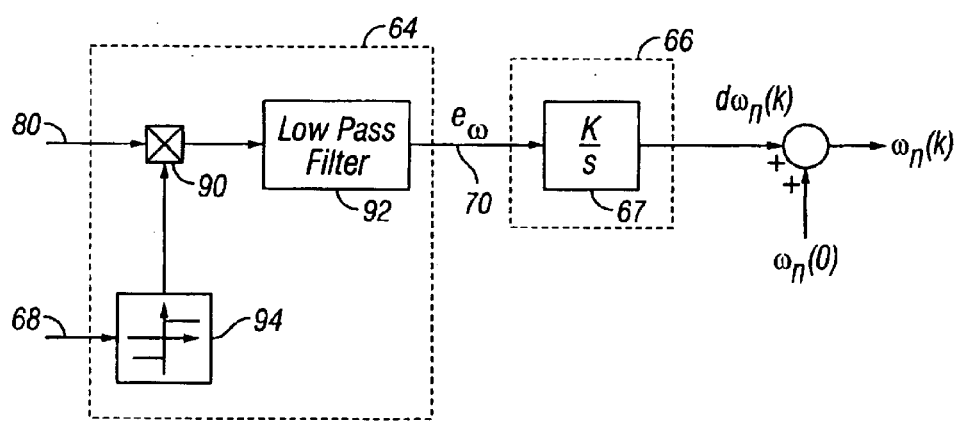
FIG. 6 is a block diagram of the preferred demodulation, post-filter, and compensation elements of the embodiment of FIG. 4.

FIG. 6 shows details of the preferred demodulator, post-filter, and compensation means. The demodulator and post-filter comprise multiplier 90, low pass filter 92, and sign detection function 94. The compensation means comprises integral compensation 67. The low pass filter is preferably second order with a bandwidth about one decade below the expected value of $\omega_n(k)$.

The advantages of the invention include the following: (1) The invention provides in a gimbaled turret or like structure a line-of-sight stabilization improvement over the entire range of gimbal position, temperature and vehicle maneuver. (2) The invention provides increased robustness to interchangeability of components and variations in assembly (e.g., preload, joint stiffness). (3) The invention relaxes stiffness and preload tolerances during assembly. (4) The invention helps reduce the size and weight of structures by relaxing the requirement that resonances be kept high in frequency. (5) The invention improves phase margin response—notches more narrow than conventional can be used. (6) The invention only requires a rough initial estimate of $\omega_n$ (in the example, within 35%, or ±80 Hz). (7) The invention does not require an external reference signal. (8) The invention works independent of source type generating the resonance, i.e., the resonance source can be additive harmonic noise or mechanical structure. (9) The invention is computationally efficient for realtime applications (12–18th order overall). (10) The sampling period requirements of the invention are comparable to digital notch filters. (11) No spectral (FFT) or system identification techniques required. (12) The invention can be implemented with analog controllers and circuits. (13) The invention reduces the need for measuring the structure of each particular system. (14) On systems that must be measured, the RANC simplifies the measurement process by automatically stabilizing the controller such that closed-loop measurements are possible. (15) The invention operates in a closed feedback loop ensuring that the notch cancels the resonance. (16) The invention is applicable, for example, to the compensation of gyroscope spin frequency noise harmonics.

Features of the invention include the following: (1) The invention monitors notch error and updates the frequency estimate to most efficiently attenuate the resonance, in that for time-varying frequencies, the best estimate is not necessarily the instantaneous frequency. (2) The invention does not require a constant input resonance amplitude, and so is useful for compensation of structural resonances where the main objective is to reduce the resonance to zero amplitude. (3) Multiple RANCs can be implemented in a single system, each operating in its own frequency range, and the designer can adjust the operating range in the pre-filters to minimize coupling between the RANCs. Reducing the frequency range of operation (by adjusting the pre-filters) allows for a larger number of RANCs implemented simultaneously, each operating in its own frequency range. (4) The invention continues running in parallel with the controller to update the estimate of $\omega_n$ if the structural resonance changes for any reason, is not affected by controller input commands or uncorrelated external disturbances, and provides for straightforward implementation of graceful degradation logic. (5) The invention provides for a compact, modular design with minimal integration impact.

The invention operates most efficiently under the following conditions: (1) Signal-to-Noise-Ratio ("S/N")>1 for the resonance being identified (i.e., S/N>1 near the frequency of interest, $\omega_n$). If the S/N drops, the estimate remains relatively constant and is not updated until the S/N is again greater than 1. (2) No other uncompensated harmonics exist with S/N>1 in the frequency range of operation ($\omega_n$±35%, or ±80 Hz in the example). Harmonics that do exist near $\omega_n$ can be filtered with conventional notch filters. Low frequency notches for such harmonics can be placed in the RANC closed-loop path without affecting the rate or acceleration loops. Additional RANCs can be used if these harmonics are varying in frequency. (3) A sampling rate of at least 3 times $\omega_n$ is preferred for digital implementations.

Additional embodiments of the invention can be used for automatic notch depth adjustment in addition to frequency and for torque disturbance rejection of harmonic disturbances (e.g., disturbances caused by helicopter rotor frequency). Non-military applications of the present invention include 1) adaptive harmonic noise identification and filtering and 2) control of flexible structures. Specific potential applications are:

1) stabilization platforms;
2) gyroscopic rate sensors;
3) computer hard-drives;
4) vehicle body bending compensation; and
5) flexible manipulators and robotics.

INDUSTRIAL APPLICABILITY

The invention is further illustrated by the following non-limiting example.

EXAMPLE 1

Figure 7:
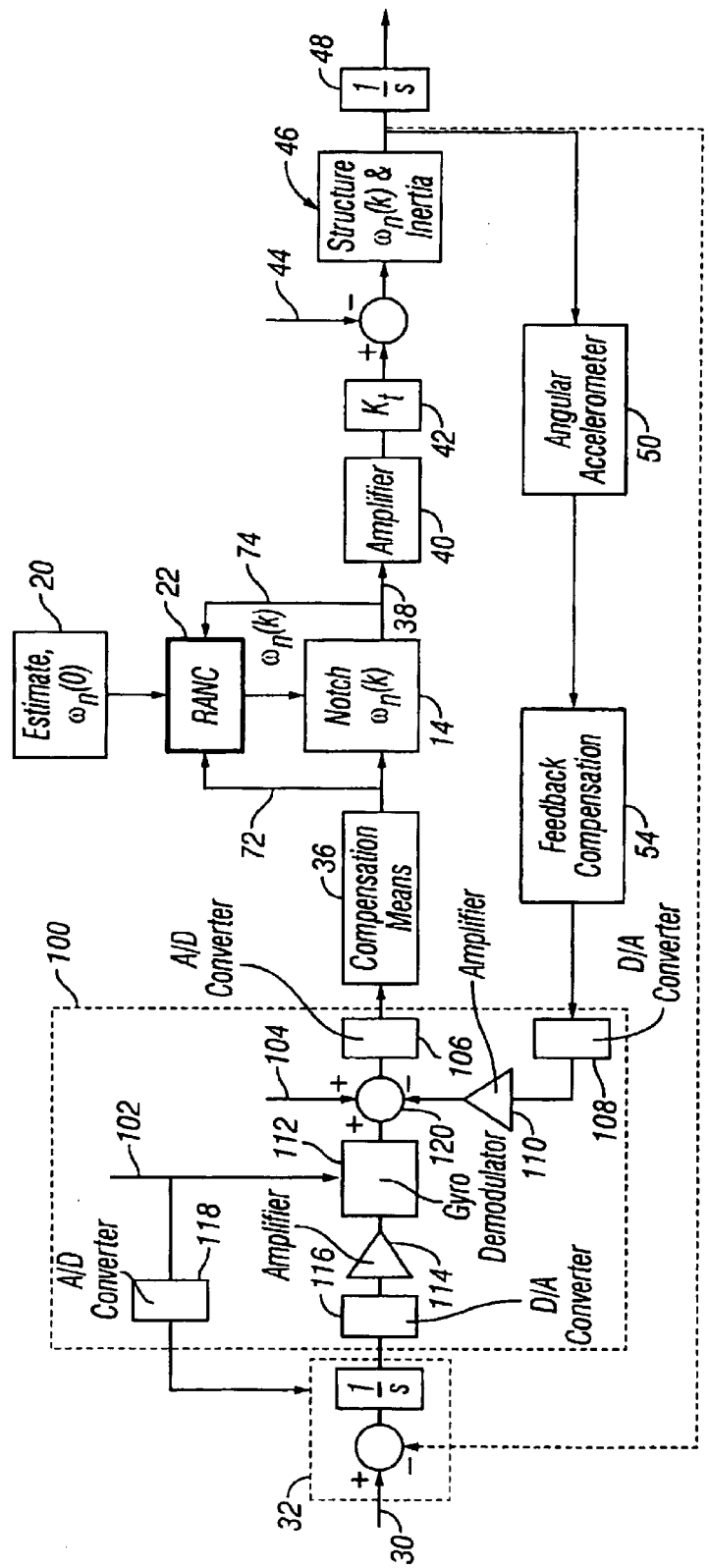
FIG. 7 is a block diagram of a hardware-in-loop experimental implementation of the invention.

A "hardware-in-the-loop" system 100 as shown in FIG. 7 was implemented which provided for realtime simulation of a yaw/pitch and azimuth/elevation gimbal system. The RANC was implemented on yaw and pitch control loops with a 3600 Hz update rate for the controller and gimbal model. Gimbals were modeled with one structural resonance each, yaw: 349 Hz and pitch: 219 Hz. The hardware was selected because it provides a significant source of electrical noise. The added components beyond those of FIGS. 2–6 are gyro reference 102, hardware demodulation noise 104, analog-to-digital converters 106,118, digital-to-analog converters 108,116, amplifiers 110,114, summing node 120, and gyro demodulator 112.

With the RANC off, the system proved unstable with initial estimates of $\omega_n$ for yaw and pitch at 310 Hz and 200 Hz, respectively. With RANC on, the system was stable even with a step change from 325/200 Hz (yaw/pitch) to 349/219 Hz and could accommodate step rate commands, that is, the RANC operated properly despite the presence of step rate commands. Structural resonance amplitude was reduced to noise level upon conversion of the RANC. For initial estimate errors within ±20%, the invention showed a 0.2 sec settling time.

The preceding example can be repeated with similar success by substituting the generically or specifically described components and/or operating conditions of this invention for those used in the preceding example.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A notch compensator comprising:
   means for receiving input to a notch filter, said input receiving means comprising a first pre-filter providing a notch output error as output;
   means for receiving output from the notch filter;
   means for dynamically calculating a desired change to a notch frequency of the notch filter; and
   means for specifying the desired change to the notch filter.

2. The notch compensator of claim 1 wherein said output receiving means comprises said first pre-filter.

3. The notch compensator of claim 1 wherein said input receiving means comprises a second pre-filter providing a reference signal as output.

4. The notch compensator of claim 3 wherein said calculating means comprises demodulation means receiving input from said first and second pre-filters.

5. The notch compensator of claim 4 wherein said demodulation means provides a frequency error as output.

6. The notch compensator of claim 5 wherein said calculating means additionally comprises integral compensation means receiving the frequency error as input.

7. The notch compensator of claim 6 wherein said integral compensation means minimizes the notch output error.

8. The notch compensator of claim 4 wherein said demodulation means comprises a low pass filter that is second order with a bandwidth about one decade below an expected value of a next notch frequency.

9. A notch compensation method comprising the steps of:
   receiving input to a notch filter, comprising employing a first pre-filter that provides a notch output error as output;
   receiving output from the notch filter;
   dynamically calculating a desired change to a notch frequency of the notch filter; and
   specifying the desired change to the notch filter.

10. The notch compensation method of claim 9 wherein receiving output comprises employing the first pre-filter.

11. The notch compensation method of claim 9 wherein receiving input comprises employing a second pre-filter that provides a reference signal as output.

12. The notch compensation method of claim 11 wherein calculating comprises demodulating employing input from the first and second pre-filters.

13. The notch compensation method of claim 12 wherein the demodulating step provides a frequency error as output.

14. The notch compensation method of claim 13 wherein the calculating step additionally comprises performing integral compensation employing the frequency error as input.

15. The notch compensation method of claim 14 wherein performing integral compensation minimizes the notch output error.

16. The notch compensation method of claim 12 wherein the demodulating step comprises employing a low pass filter that is second order with a bandwidth about one decade below an expected value of a next notch frequency.

17. A notch filtering system comprising a notch filter and a notch compensator, the notch compensator comprising:
   means for receiving input to a notch filter, said input receiving means comprising a first pre-filter providing a notch output error as output;
   means for receiving output from the notch filter;
   means for dynamically calculating a desired change to a notch frequency of the notch filter; and
   means for specifying the desired change to the notch filter.

18. The notch filtering system of claim 17 wherein said system is employed in an application selected from the group consisting of reducing structural resonances in control of mechanical structures, reducing noise harmonics of time varying and/or uncertain frequency, adaptive harmonic noise identification, adaptive harmonic noise filtering, and control of flexible structures.

19. The notch filtering system of claim 17 wherein said system is employed in an application selected from the group consisting of control of gimbaled turrets, control of helicopters, stabilization platforms, gyroscopic rate sensors, computer hard drives, vehicle body bending compensation, and flexible robotic manipulators.

* * * * *